United States Patent [19]

DeCecco et al.

[11] 3,947,726

[45] Mar. 30, 1976

[54] REVERSE VOLTAGE SURGE PROTECTION FOR HIGH-VOLTAGE THYRISTORS

[75] Inventors: Angelo L. DeCecco, Newtown Square; Donald M. Demarest, Wallingford; Dante E. Piccone, Philadelphia; Istvan Somos, Lansdowne, all of Pa.

[73] Assignee: General Electric Co., Philadelphia, Pa.

[22] Filed: Dec. 18, 1974

[21] Appl. No.: 534,030

[52] U.S. Cl............... 317/16; 317/31; 317/33 SC; 317/43; 321/11
[51] Int. Cl.² ........................................ H02H 7/14
[58] Field of Search............ 317/16, 31, 33 SC, 43, 317/41; 321/11, 27 R; 307/202

[56] References Cited
UNITED STATES PATENTS

| | | | |
|---|---|---|---|
| 3,246,206 | 4/1966 | Chowdhuri | 317/31 |
| 3,330,993 | 7/1967 | Ulrich | 317/33 SC |
| 3,579,082 | 5/1971 | Bossi | 321/11 |
| 3,629,685 | 12/1971 | Johansson | 321/13 |
| 3,793,535 | 2/1974 | Chowdhuri | 307/202 |

OTHER PUBLICATIONS
GE–SCR Manual (1967), pp. 155, 326–330.

Primary Examiner—James D. Trammell
Attorney, Agent, or Firm—Joseph H. Yamaoka; J. Wesley Haubner

[57] ABSTRACT

A thyristor is shunted by a metal oxide varistor in series with switching means which switches abruptly from a normal high-resistance state to a low-resistance, current conducting state when the thyristor is subjected to a transient surge of reverse bias voltage the magnitude of which is higher than a predetermined repetitive peak magnitude and is nearly equal to the level at which the thyristor turns on in an avalanche breakdown mode. The voltage-current characteristic of the varistor is coordinated with the reverse breakdown characteristic of the thyristor so that surge current will divide therebetween in such proportions that the maximum reverse current flowing through the thyristor is lower than a predetermined critical magnitude which can damage the same, whereby the thyristor is able safely to participate in the surge-energy dissipating process.

10 Claims, 7 Drawing Figures

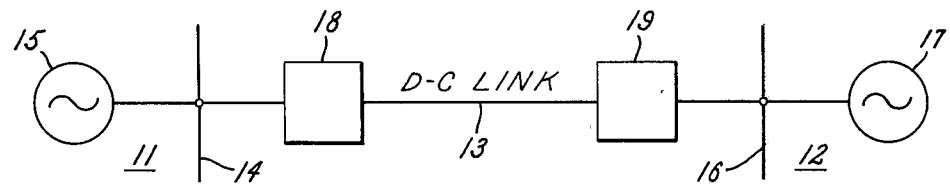
Fig. 1.
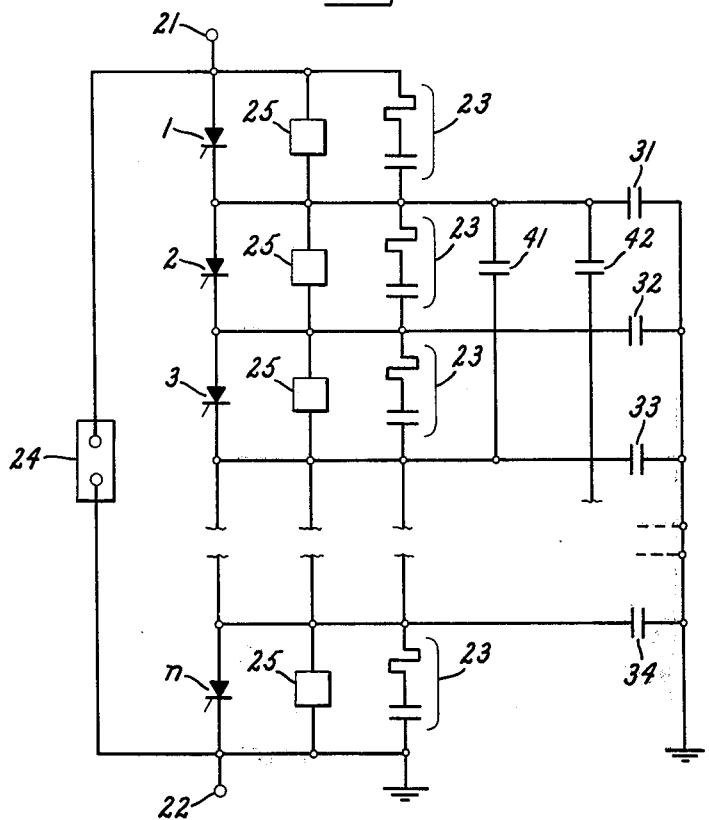
Fig. 2.
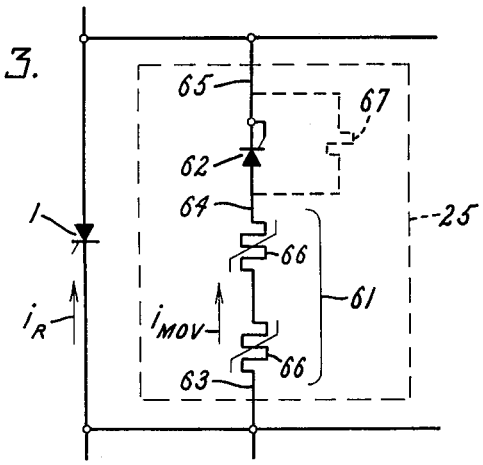
Fig. 3.
Fig. 3a.

REVERSE VOLTAGE SURGE PROTECTION FOR HIGH-VOLTAGE THYRISTORS

This invention relates generally to high power thyristors that can be used to form high-voltage solid-state controllable electric valves for rectifying or inverting bulk electric power in a high voltage direct current (HVDC) transmission system, and more particularly it relates to a scheme for protecting such thyristors from damage due to high-energy surges of reverse blocking voltage.

The following U.S. patents and publications are indicative of prior approaches in the pertinent art: U.S. Pat. No. 3,246,206-Chowdhuri; U.S. Pat. No. 3,629,685-Johansson; 3,793,535-Chowdhuri; General Electric SCR Manual, pp. 155 and 326–30 (4th ed. 1967).

"Thyristor" is a generic name for a family of solid-state bistable switches, including silicon controlled rectifiers (SCRs), which are physically characterized by a semiconductor wafer having a plurality of layers of alternately P- and N-type conductivities between a pair of main current-carrying metallic electrodes (designated the anode and the cathode, respectively). Such semiconductor devices are equipped with suitable gating means for initiating forward conduction between the main electrodes on receipt of an appropriate control or trigger signal. Where high current ratings are desired (e.g., 1,250 amps average) a semiconductor wafer of relatively large area is used, and to obtain high voltage ratings (e.g., 2,600 volts peak) the base layers in the wafer are made relatively thick. To form a higher voltage solid-state controllable electric valve, a plurality of such thyristors can be interconnected in series and operated in unison. By suitable interconnecting and arranging a plurality of such valves to form an a-c switch or an a-c/d-c converter, the flow electric power can be controlled in a high voltage alternating current circuit or in an HVDC system.

During those cyclically recurring intervals when the above-mentioned high voltage valve is in an off or blocking state, the valve and its associated equipment are prone to being damaged by extra high voltage surges that may be produced at random times by a variety of different transient disturbances, such, for example, as lightning strokes, bushing flashovers, or inverter commutation failures. Such over voltage transient can rise far above the working or cyclical peaks of the normal system voltage. To divert and suppress these transient surges, a lightning arrester is commonly connected across each valve. See, for example, U.S. Pat. No. 3,513,354-Sakshaug and Kresge. To further protect the individual thyristors from forward voltage breakover, it is also desirable to use an overvoltage responsive triggering scheme such as the one that is disclosed and claimed in prior U.S. Pat. No. 3,662,250-Piccone and Somos. The present invention is concerned with protecting the individual thyristors from damage during a high-energy transient surge of reverse voltage on the valve.

When a thyristor is subjected to excessive voltage in the reverse direction (anode potential negative with respect to cathode), it can switch from a reverse blocking state to a reverse current conducting state. This turn on action is known as an avalanche breakdown, and the critical level of reverse voltage at which it occurs is called the reverse breakdown voltage ($V_{(BR)R}$). When turned on in this manner the thyristor can conduct a substantial amount of reverse current without damage, so long as the breakdown occurs on a single-shot basis (non-repetitive) and the reverse current does not exceed a destructively high peak nor last longer than a relatively brief time. Transient energy is safety dissipated within the bulk of the thyristor, and when the surge of reverse current subsides the thyristor fully recovers its reverse blocking capability. However, if the surge current magnitude and duration exceeds the energy dissipating capability of the thyristor during reverse avalanche, it must be harmlessly diverted to prevent destruction of the thyristor. A conventional lightning arrester cannot be counted on for this purpose because its operating speed is likely to be too slow to protect either the full valve or each of its constituent thyristors, especially under a condition of unequal voltage distribution which occurs when a very steep-front surge of abnormally high reverse voltage is applied to the converter valve.

It has heretofore been proposed to suppress overvoltages by connecting across individual thyristors a voltage-variable non-linear resistor known as a metal oxide "varistor" (MOV). A MOV comprises a sintered body of ceramic material (such as zinc oxide plus a small quantity of bismuth oxide) whose resistance will switch from an extremely high standby value for applied voltages of less than a so-called breakover voltage level to very low conducting values for voltages above the breakover level, thereby limiting the rise of voltage to a safe maximum level.* The manner in which the current (I) in a MOV varies as a power of the voltage (V) across it can be expressed by the equation:

$$I = \left(\frac{V}{C}\right)^\alpha ,$$

where the constant $C$ equals the magnitude of $V$ when $I = 1$ ampere, and the exponent $\alpha$ is a number greater than 10.

*By definition, the peak voltage across a varistor when conducting idling current of one milliamp (peak) is referred to as the "breakover voltage," and the maximum level to which the voltage rises when the varistor is conducting the instantaneous peak current of an overvoltage transient is referred to as the "peak clamping voltage."

Such a varistor has the desirable features of having a high degree of non-linearity, switching with negligible delay time (less than 50 nanoseconds), having high energy handling capability, and being capable of being fabricated in a variety of shapes of various sizes. Its electrical characteristics are determined by the geometry of the body formed from the polycrystalline material and by the composition thereof, with C being primarily a function of the material grain size and $\alpha$ being primarily a function of the grain boundary. More information about metal oxide varistors can be found on pages 477–81 of the SCR Manual (5th ed.) published in 1972 by the General Electric Co., Electronics Park, Syracuse, N.Y. 13201, and commercially available models are identified in the condensed specification on page 656 of the same Manual.

MOV's that are commercially available at this writing are not entirely satisfactory for protecting the thyristors in a solid-state HVDC valve from high-energy transient surges of excessive reverse blocking voltage because of their tendency to be unstable at very high voltage levels. By "unstable" we mean that the voltage-current characteristic of an MOV may drift or change with time if the varistor were repeatedly subjected to voltage peaks higher than its breakover voltage. Such high voltage levels also tend to cause overheating in the MOV, and this too is a degrading influence.

Accordingly, a general objective of our invention is to provide, for protecting a thyristor from damage due to excessive reverse blocking voltage, of an improved protective scheme that avoids the shortcomings of the prior art approaches in the environment of solid-state HVDC electric valves.

In carrying out our invention in one form, we connect across the main electrodes of a thyristor the series combination of non-linear resistance means, which comprises at least one metal oxide varistor, and switching means such as a PNPN semiconductor element poled inversely with respect to the thyristor. The switching means is operative to switch abruptly from a normal high-resistance state to a low-resistance, current conducting state if subjected to a voltage which attains a predetermined breakover value. Its switching characteristic is coordinated with the voltage-current characteristic of the varistor so as to switch to its current conducting state in high-speed response to the magnitude of reverse bias voltage on the thyristor increasing to a level which is higher than a predetermined repetitive peak reverse voltage ($V_{RRM}$) and which nearly equals the reverse breakdown voltage of the thyristor. The voltage-current characteristic of the varistor is coordinated with the reverse breakdown characteristic of the thyristor so that after a surge of reverse bias voltage causes the aforesaid switching means to operate, the surge current will divide between the thyristor and the parallel-connected varistor in such proportions that the maximum reverse current flowing through the thyristor is lower than a predetermined critical magnitude which might damage the same. As current increases to its maximum value in the varistor, the surge of reverse voltage across the parallel thyristor is safely limited to the peak clamping voltage of the MOV. At the same time, the thyristor is conducting a significant amount of reverse current which, while within its inherent reverse avalanche capability, is substantial enough (e.g., one-third of the total surge current at the peak magnitude thereof) to relieve appreciably the energy dissipating duty of the varistor. Consequently the size and the cost of the varistor can be kept relatively small. So long as the reverse bias voltage does not exceed $V_{RRM}$, the aforesaid switching means remains in its normal high-resistance state, whereby the varistor is not exposed to the high, repetitive reverse voltage peaks which would otherwise jeopardize its stability.

Our invention will be better understood and its various objects and advantages will be more fully appreciated from the following description taken in conjunction with the accompanying drawings in which:

FIG. 1 is a schematic one-line diagram of a high-voltage direct-current electric power delivery system including converters using solid-state valves in which our invention can be advantageously embodied;

FIG. 2 is a schematic circuit diagram of a string of serially interconnected thyristors comprising one of the valves used in the converters shown in block form in FIG. 1;

FIG. 3 is a schematic circuit diagram of the parallel combination of a thyristor and overvoltage protective means illustrating a preferred embodiment of our invention and comprising one of the reiterative levels which form the valve shown in FIG. 2;

FIG. 3a is a schematic diagram of a modified form of the switching means used in the overvoltage protective means which is illustrated in FIG. 3;

Figure 6:
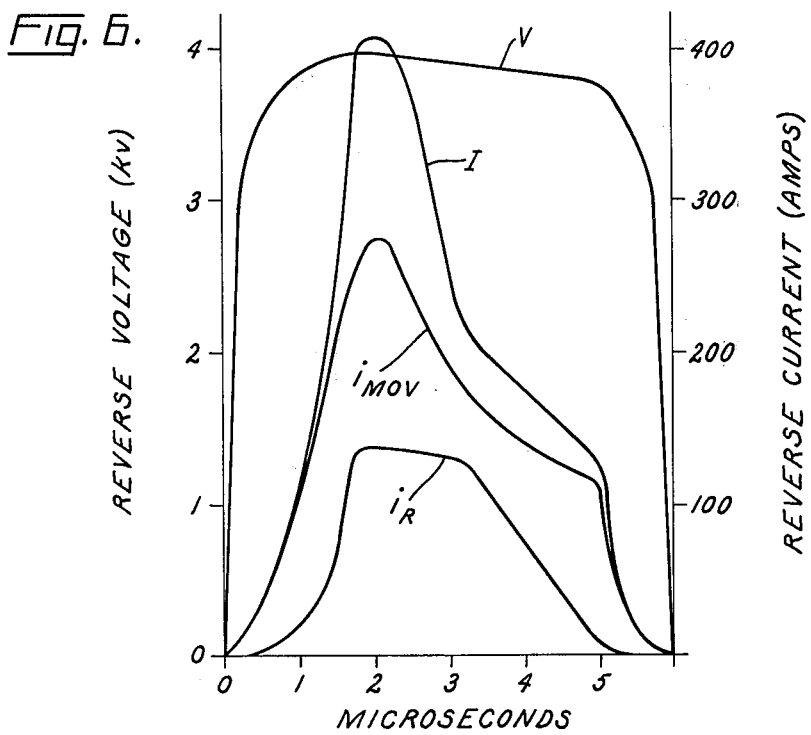
Figure 5:
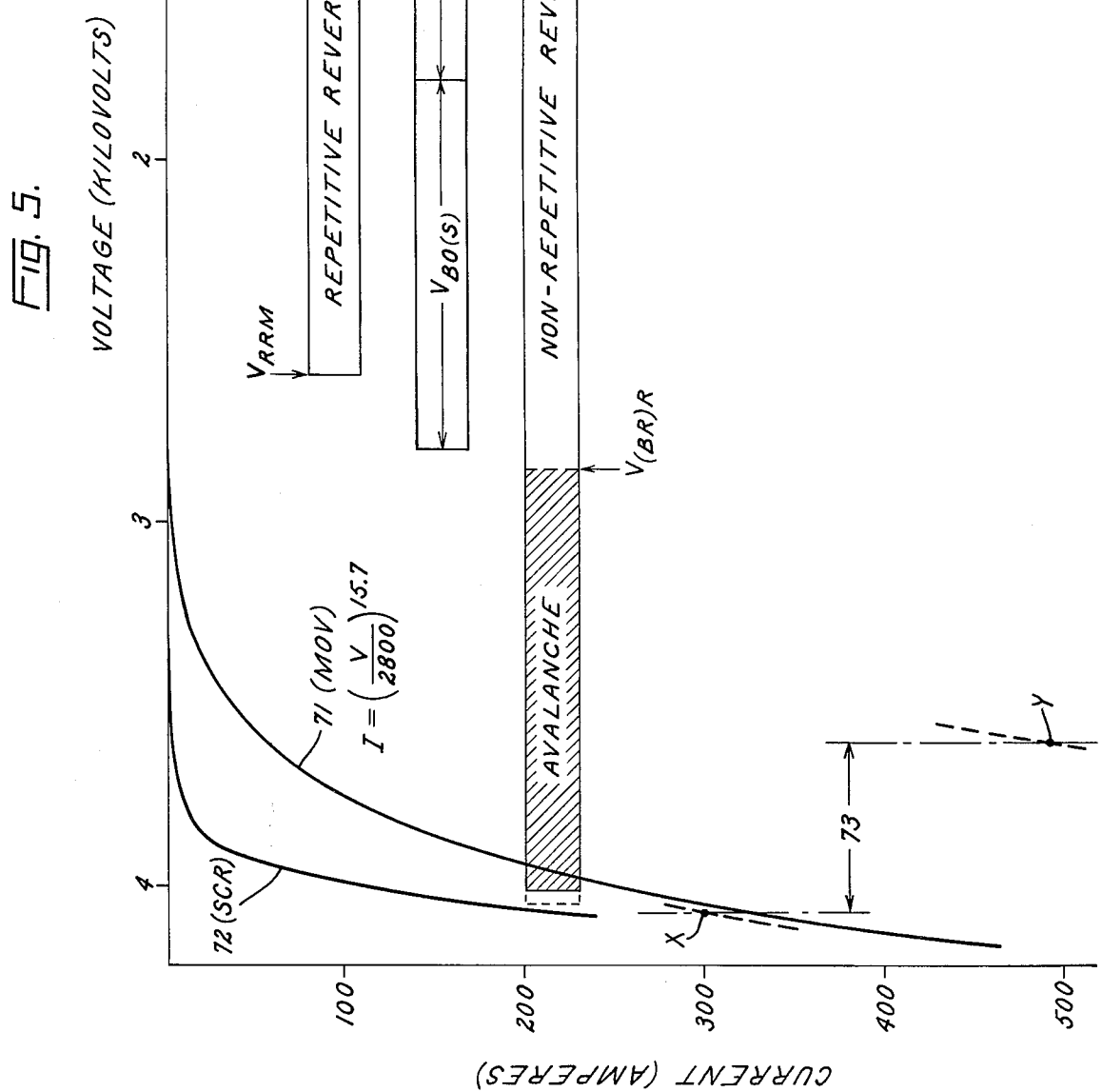

FIG. 5 is a chart of current vs. voltage showing the reverse breakdown characteristic of a typical thyristor and the voltage-current characteristic of a typical metal oxide varistor which can be used in practicing our invention; and FIG. 6 is a chart of both voltage and current vs. time illustrating a half-cycle surge of reverse current through the FIG. 3 circuit, which current has a sinusoidal waveform, a peak magnitude of 400 amperes, and a duration of 5 micro-seconds.

The first two figures of the drawings illustrate one practical application of a protective scheme embodying our invention. FIG. 1 is a one-line representation of two high-voltage polyphase alternating current electric power systems 11 and 12 which are interconnected by a d-c link 13. The a-c system 11 comprises a bus 14 to which electricity is supplied by an appropriate source 15, and the a-c system 12 comprises a bus 16 from which electricity is delivered to a connected load circuit 17. Additional loads (not shown) can be connected to the bus 14 of system 11, and other sources (not shown) can be connected to the bus 16 of system 12. The separate buses 14 and 16 are respectively coupled to opposite terminals of the interconnecting d-c link 13 by way of suitable electric power converter stations 18 and 19.

Each of the converters 18 and 19 comprises a conventional arrangement of power transformers, a-c/d-c bridges, and means for supplying firing pulses to the controllable electric valves which are used to form each bridge. Normally the converter 18 is operated in a rectifying mode and the converter 19 is operated in an inverting mode, whereby bulk electric power can be transmitted in the form of high voltage direct current from the a-c system 11 to the a-c system 12. For more information about the art of High Voltage Direct Current Power Transmission, see the book of that title by Colin Adamson and N. G. Hingorani (published in 1960 by Garraway, Ltd., London, England).

Each bridge in each of the converters 18 and 19 usually comprises six identical solid-state controlled valves arranged in a 3-phase double-way 6-pulse configuration having three separate a-c terminals and a set of positive and negative d-c terminals. In the present state of the art, each valve will comprise a string of serially interconnected thyristors which have individual voltage ratings lower than the required voltage rating of the valve. Such a valve is shown in greatly simplified form in FIG. 2. It comprises a plurality of duplicate high-power thyristors 1, 2, 3, ... n which are series conneted in polarity agreement between the valve anode 21 and cathode 22. One of the latter electrodes is adapted to be connected to an a-c terminal of the bridge in which the valve is located, and the other is connected to one of the d-c terminals of the bridge. For higher current ratings, additional thyristors can be respectively connected in parallel with the thyristors shown in FIG. 2.

One each cycle of the a-c system voltage, at a time when a forward bias voltage is impressed on the illustrated valve (i.e., when the potential of the anode 21 is positive with respect to the cathode 22), all of the constituent thyristors 1, 2, 3, ... n are fired or turned on in unison by operation of associated control means (not shown) coupled to their respective gate electrodes. To ensure proper turnon action, the valve should include commutation transient suppressing means (not shown) such as described and claimed in U.S. Pats. No. 3,423,664-Dewey and U.S. Pat. No. 3,626,271Dewey. Once the valve turns on, it will freely conduct load current in a forward direction until subsequently turned off by line voltage commutation, whereupon it remains off until fired again one cycle later. Because of slight discrepancies that commonly exist among the individual switching characteristics of a plurality of thyristors, it is standard practice to promote voltage sharing among the respective thyristors of the valve by connecting in shunt therewith an R-C bypass network comprising, across each level of the valve, a voltage equalizing series resistor-capacitor subcircuit 23. Each subcircuit typically includes a resistor of 10 ohms and a capacitor of four to 10 microfarads. The benefits of such a bypass network are more fully explained in the first-mentioned Dewey patent.

The illustrated valve is designed to withstand the voltage applied across its anode 21 and cathode 22 during its periodic off or nonconducting intervals. At the inverting or "receiving" end of the d-c link 13, this voltage will forward bias the valve for most of the nonconducting interval, whereas at the rectifying or "sending" end of the link the applied voltage reversely biases the valve (i.e., anode potential negative with respect to cathode). Although shown grounded in FIG. 2, it should be understood that the cathode 22 could alternatively have an absolute potential appreciably more negative (or more positive) than ground, depending on where the valve is located in the bridge, where the bridge is positioned in a pole, and whether the converter is operating in the rectifying or inverting mode. When the illustrated valve is reverse biased, its anode potential will be negative with respect to ground, but if instead of being grounded the cathode 22 were at a relatively positive potential, the reverse-biased anode could then have a potential which is either equal to or more positive than ground.

At various times during each nonconducting interval, the valve will be subjected to high peak voltages which the associated power system normally imposes thereon. In addition, abnormal voltage surges may be randomly produced by transient phenomena such as lightning strokes or bushing or bush flash-overs. To help prevent damage to the valve due to excessively high reverse or forward blocking voltages, suitable voltage surge suppressors are commonly used. For this purpose a lightning arrestor 24 has been shown connected across the valve of FIG. 2. This arrestor is relatively slow in operation, and since it is connected across the whole valve there is no guarantee that each constituent thyristor of the valve will not individually be subjected to excessive voltage. To prevent destructive breakover of any of the individual thyristors in the event of a steep-front surge of excessive forward bias voltage, it is therefore good practice to provide at each level of the valve an overvoltage voltage responsive triggering scheme (not shown) such as described and claimed in U.S. Pat. No. 3,662,250-Piccone and Somos.

To prevent damage to any of the individual thyristors if turned on in the reverse breakdown mode due to a steepfront surge of excessive reverse bias voltage, each level of the valve is shunted by overvoltage protective means 25. The latter means is constructed and arranged in accordance with our present invention which will soon be explained in conjunction with the description of FIGS. 3 and 5.

In FIG. 2 the capacitors 31, 32, 33, 34 and 41, 42 represent distributed or stray capacitances from the constituent thyristors 1, 2, 3, ... n of the valve to ground and between multiple levels of the valve. Such stray capacitances always exist when a high voltage solid-state valve is assembled. Their capacitive values are characteristically small (50 to 100 picofarads) but non-uniform. When the anode potential of the valve abruptly changes with respect to the cathode 22, the stray capacitance will significantly influence the voltage division within the series-connected string of thyristors, and some of these thyristors may consequently be subjected to a disproportionately higher voltage than other. To illustrate this effect, assume that a fast rising voltage of relatively negative polarity is suddenly applied to the anode 21, thereby increasing the charge on each of the various stray capacitances to ground (31, 32, etc.). At each level of the valve, the magnitude of charging current in the associated stray capacitance is equal to Cdv/dt, where C is the stray capacitive value and dv/dt is the rate at which the voltage at that particular level is changing with respect to ground. All of the resulting charging currents will flow through the subcircuit 23 shunting the first thyristor 1 which is closest to the anode 21 where dv/dt is highest, whereas a lower current (equal to the total charging current minus the increment attributed to the stray capacitance 31) traverses the subcircuit 23 which is connected across the next thyristor 2. Therefore in this example the first level of the valve initially experiences a higher reverse bias voltage than any of the other levels, and there is a possibility that the reverse breakdown voltage ($V_{(BR)R}$) of thyristor 1 will be exceeded.

Figure 4:
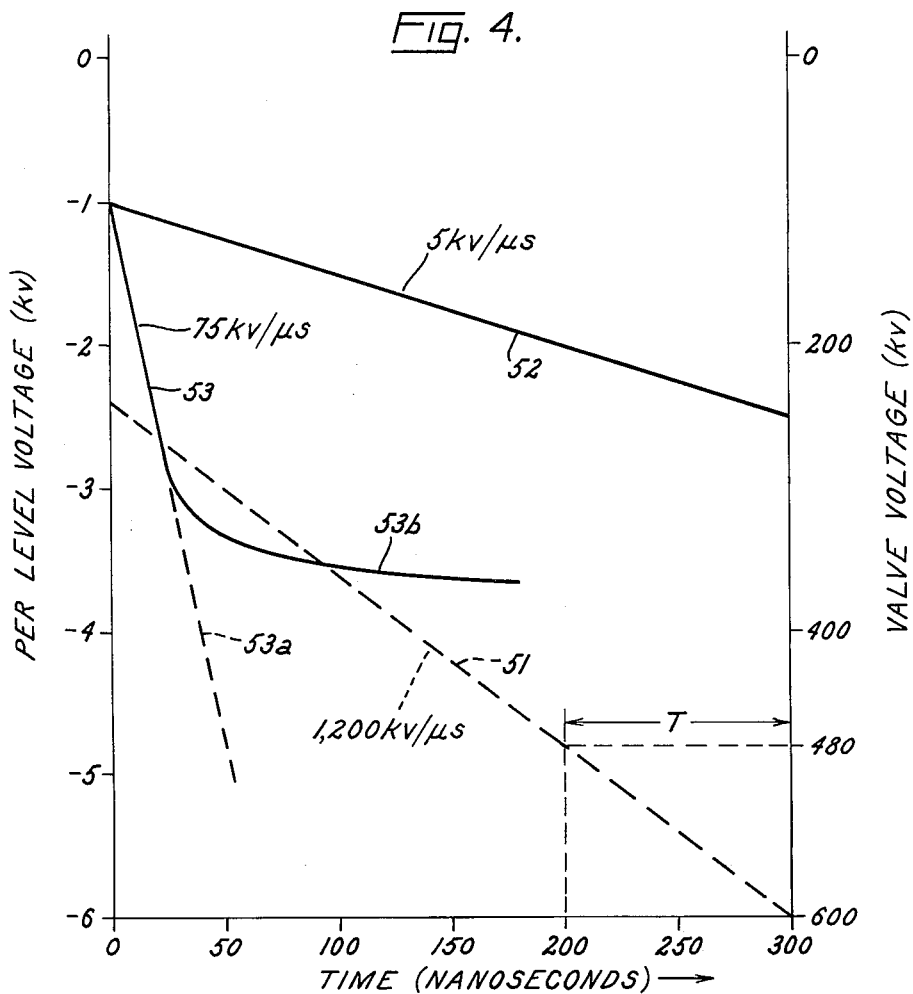
FIG. 4 is a chart of voltage vs. time showing voltages across the whole valve and across certain levels thereof during the early stages of a transient surge of reverse blocking voltage.

FIG. 4 demonstrates what can happen in a valve when subjected to a surge of reverse bias voltage which rises at a very high rate. It is assumed that such a surge superimposed super-imposed on the normal maximum reverse blocking voltage of the valve. It is further assumed that the latter voltage is 240kv, that there are of the order of 240 thyristors in series in the valve, andd therefore that the working peak reverse voltage per thyristor ($V_{RWM}$) is approximately 1kv. In FIG. 4 the broken line 51 represents a transient surge of reverse bias voltage on the valve, which voltage is increasing in magnitude at a constant rate of minus 1,200kv per microsecond. If this increasing voltage were shared uniformly by all levels of the valve, the reverse blocking voltage on each thyristor would rise at the rate of minus 5kv per microsecond, as is depicted by the solid line 52 in FIG. 4. It will be observed that at this average rate of rise, the reverse blocking voltage 52 reaches a magnitude of 2kv after 200 nanoseconds which is approximately the time required for the valve voltage 51 to attain the threshold or spark-over magnitude of the lightning arrestor 24 (assumed to be 480kv), and after an additional 100 nanoseconds, which approximates the operating time T of the lightning arrestor for a voltage surge of 1,200kv/μs, the thyristor voltage 52 is still at a safe level of 2.5kv.

In practice, some of the thyristors (such as thyristor 1 in the example given above) can experience a much faster than average rise in reverse blocking voltage, and a rate 15 times higher is shown by the line 53 in FIG. 4.

If the reverse bias voltage on the thyristor 1 continued to increase at this higher rate, it would reach a dangerously high level of nearly 5kv in only 50 nanoseconds, as is indicated by the straight line extension 53a of line 53. This is far in advance of the lightning arrestor operation. However, as the reverse bias voltage on thyristor 1 approaches 3kv, this thyristor has an avalanche breakdown which, in combination with the operation of the overvoltage protective means 25, thereafter clamps this voltage (as indicated by the bend 53b in the line 53) to a safe maximum level.

A preferred embodiment of the reverse overvoltage protective means 25 is shown in FIG. 3. It comprises voltagevariable non-linear resistance means 61, switching means 62, and wires 63, 64 and 65 which connect the resistance means 61 and the switching means 62 in series with each other and in parallel with the associated thyristor 1. Preferably the switching means 62 comprises a PNPN semiconductor element which is poled inversely to the main thyristor 1, and in FIG. 3 it is shown simply as an auxiliary thyristor whose gate electrode is connected either internally or directly externally to its cathode. This auxiliary thyristor 62 has a normal high-resistance state. It is operative to switch abruptly to a low-resistance, forward current conducting state if subjected to a voltage of a predetermined breakover value $V_{BO(S)}$. The switching characteristic of the auxiliary thyristor 62 is coordinated with the voltagecurrent characteristic of the non-linear resistance means 61 so that the thyristor 62 will switch to its current conducting state in high-speed response to the magnitude of the reverse bias voltage across the main thyristor 1 increasing above $V_{RRM}$ and nearly equaling $V_{(BR)R}$.

The non-linear resistance means 61 of the overvoltage protective means 25 comprises at least one MOV 66; as illustrated in FIG. 3 we prefer to use two duplicate MOVs 66 in series. The voltage-current characteristic of this means is coordinated with the reverse breakdown characteristic of the main thyristor 1 so that when the auxiliary thyristor 62 switches to its current conducting state due to a surge of reverse bias voltage, surge current will divide between the resistance means 61 and the main thyristor 1 in such proportions that the maximum value of reverse current in the main thyristor 1 does not exceed a predetermined critical magnitude which can damage this component.

For a better general understanding of the requisite coordination between the main thyristor and the parallel non-linear resistance means, a typical example will now be considered with the aid of FIGS. 5 and 6. In FIG. 5 the curve 71 represents the voltage-current characteristic of the non-linear resistance means 61 (which actually comprises two MOVs 66 in series), and the curve 72 represents the reverse breakdown characteristic of the main thyristor 1. In this example the main thyristor is assumed to have a reverse breakdown level $V_{(BR)R}$ of approximately 2.8kv, and if the instantaneous magnitude of a surge of non-repetitive reverse bias voltage increases beyond this level, the main thyristor will experience an avalanche breakdown which causes it to switch from a reverse blocking state to a reverse current conducting state. The working peak reverse voltage across the main thyristor is assumed to be in a range of approximately 1.0 to 1.2kv, and the repetitive peak reverse voltage ($V_{RRM}$) is assumed to be 2.6kv which is more than twice $V_{RWM}$. (The relatively high magnitude of $V_{RRM}$ is due to transient commutation voltage overshoot associated with those levels of the valve whose thyristors have the smallest reverse recovery currents.)

The voltage-current characteristic 71 of the non-linear resistance means 61 is defined by the equation $I = (V/C)^\alpha$. Proper selection of the exponent alpha and the constant C is based on certain additional given information about the avalanche capability of the main thyristor and about the nature of the non-repetitive reverse overvoltage transients to which the thyristor is exposed. For the present example, it will be assumed that such transients involve a half-cycle surge of reverse current having a sinusoidal waveform and a period of 5microseconds during which or upon the expiration of which the surge either is suppressed by spark over of the associated lightning arrestor or otherwise subsides. During this period, on a non-repetitive, single-shot basis, the main thyristor can safely conduct reverse current up to a predetermined critical maximum or peak value $I_{RM}$. Typically $I_{RM} = 200$ amps, but in some cases it can be much higher or lower than this magnitude. In the illustrated example, the reverse voltage across the thyristor at 200 amps is approximately 4050volts. It is further assumed that at this voltage the worst-case peak magnitude of surge current which is to be divided between the main thyristor and the parallel non-linear resistance means is 500 ampères. Consequently a first constraint on the design of the resistance means 61 is that it conduct more current than the difference (e.g., 300 amps) between this peak magnitude of surge current (500 amps) and $I_{RM}$ (200 amps) when the magnitude of voltage across it is the same (e.g., 4050 volts) as the voltage across the thyristor when conducting $I_{RM}$. In other words, in this particular example the non-linear resistance means should have a voltage drop less than 4050 volts when conducting 300 amps. The 300-amp, 4050-volt point is shown at X in FIG. 5.

A second constraint in the selection of the exponent alpha and the constant C of the non-linear resistance means 61 is that this means must not conduct all of the surge current at the peak magnitude thereof. The main thyristor can absorb an appreciable portion of the reverse current surge. As a minimum, current in the main thyristor should equal 1% of the worst-case peak magnitude of surge current, which in the present example is at least 5 amperes. For the illustrated reverse breakdown characteristic curve 72, the voltage across the main thyristor is approximately 3600 volts when conducting reverse current of 5 amps, and consequently the magnitude of current in the non-linear resistance means must be no greater than 495 amps at the same voltage. The 495-amp, 3600-volt point is shown at Y in FIG. 5. Between the points X and Y is a range 73 in which the non-linear resistance means 61 will divert from the main thyristor 1 between approximately 60 and 99% of the total surge current flowing through these paralleled elements at the 500-amp peak magnitude thereof.

Preferably the parameter C of the MOV is given a magnitude approximating the reverse breakdown level of the main thyristor, whereby current in the non-linear resistance means 61 of FIG. 3 will have a magnitude of 1 ampere when the reverse bias voltage across the main thyristor has increased to the vicinity of $V_{(BR)R}$. Any magnitude within a range of approximately plus and minus 15 percent of $V_{(BR)R}$ is satisfactory for C, and a magnitude below this range can be used if desired.

To obtain the particular voltage-current characteristic 71 shown in FIG. 5, we have chosen a constant C of approximately 2800 and an $\alpha$ of approximately 15.7. These parameters satisfy the various constraints discussed above. (Persons skilled in the art will understand that if the non-linear resistance means 61 actually comprises a serial combination of two or more MOVs 66 among which the total voltage V is equally divided, the magnitude of C for each of the individual MOVs has to be correspondingly reduced.) In this example the 500-amp peak magnitude of the reverse surge current is reached at a safe peak clamping voltage of approximately 4040 volts, at which point the amount of current flowing through the main thyristor 1 is approximately three-fifths as much as the current in the parallel non-linear resistance means 61.

The breakover voltage $V_{BO(V)}$ of a non-linear resistance means having the values of $\alpha$ and C that are specified in the preceding paragraph is approximately 1800 volts which is much lower than the given value of $V_{RRM}$. To save the resistance means 61 from exposure to this higher repetitive peak reverse voltage, our overvoltage protection means 25 includes the switching means 62 which in FIG. 3 is shown as an auxiliary thyristor. The breakover current of the auxiliary thyristor 62 should be the same as the idling current of the non-linear resistance means 61, namely one milliamp (peak). This is the threshold magnitude of current which must flow through the switching means in order to switch from its normal high-resistance state to a low-resistance, current conducting state when the forward bias voltage across the auxiliary thyristor attains its breakover value $V_{BO(S)}$. In accordance with our invention, the sum of $V_{BO(S)}$ and $V_{BO(V)}$ exceeds $V_{RRM}$ and nearly equals $V_{(BR)R}$. As has been shown by way of example in FIG. 5, $V_{BO(S)}$ is approximately 1000 volts, whereby the auxiliary thyristor 62 breaks over when a surge of non-repetitive reverse voltage has attained a magnitude of approximately 2800 volts. The switching time of the auxiliary thyristor plus the delay time of the metal oxide varistors 66 will approximately match the reverse breakdown delay time of the main thyristor, and consequently the peak voltage clamping action of the MOVs and the avalanche action of the main thyristor take place concurrently.

If the inherent breakover current of the element used for the switching means 62 were lower than one milliamp, it is desirable to connect a calibrating resistor 67 of appropriate size in parallel circuit relationship therewith so as to increase the current flowing between conductors 64 and 65 to substantially one milliamp at the breakover point of the auxiliary thyristor. This option is indicated by the broken lines in FIG. 3.

In lieu of the FIG. 3 arrangement of an auxiliary thyristor having a $V_{BO}$ of 1000 volts, the switching means 62 can comprise an auxiliary thyristor 62a of slightly higher $V_{BO}$ value, with the gate electrode of the latter thyristor being connected to its anode by way of an additional PNPN semiconductor element 68 as is shown in FIG. 3a. The breakover voltage value of the additional element 68 is 1000 volts. The FIG. 3a arrangement enhances the di/dt capability of the overvoltage protective means and is particularly desirable at ambient temperatures higher than room temperature.

FIG. 6 shows the division of current between the main thyristor 1 ($i_R$) and the overvoltage protective means 25 ($i_{MOV}$) for a reverse overvoltage transient V which is assumed to rise from zero at a rate of approximately 20 kv/$\mu$s to a relatively flat peak magnitude of 4 kv and then to subside after a period of approximately 5 microseconds. The main thyristor and the non-linear resistance means in the overvoltage protective means have the exemplary characteristics illustrated in FIG. 5. The maximum or peak of $i_R$ is approximately one-third the 410-amp peak magnitude of the sum (I) of the reverse surge currents $i_R$ and $i_{MOV}$, and the peak of $i_{MOV}$ is approximately two-thirds that of I. Thus the surge energy dissipation duty is shared jointly by the main thyristor in its reverse avalanche state and by the parallel non-linear resistance means. The limited amount of energy that the main thyristor has to dissipate is sufficiently small to prevent self destruction, yet it is large enough to relieve the non-linear resistance means of the burden of absorbing the total surge energy.

While we have shown and described a preferred form of our invention by way of illustration, many modifications will probably occur to those skilled in the art. For example, the overvoltage protective means 25 could be advantageously used to protect other types of devices or switches having characteristics similar to the main thyristors 1, 2, etc., previously described. We therefore intend by the claims which conclude this specification to cover all such modifications as fall within the true spirit and scope of our invention.

What we claim as new and desire to secure by Letters Patent of the United States is:

1. An improved scheme for protecting a thyristor having a pair of main electrodes adapted to be connected in an electric power circuit where they are periodically subjected to a reverse bias voltage (anode potential negative with respect to cathode), said thyristor being adapted to switch from a reverse blocking state to a reverse current conducting state if the instantaneous magnitude of the reverse bias voltage increases to a level sufficiently in excess of a predetermined repetitive peak reverse voltage to cause an avalanche breakdown therein, wherein the improvement comprises:

a. non-linear resistance means comprising at least one metal oxide varistor;
   b. switching means having a normal high-resistance state and being operative to switch abruptly to a low-resistance, current conducting state if subjected to a voltage which attains a predetermined breakover value;
   c. means for connecting said resistance means and said switching means in series with each other and in parallel with said thyristor;
   d. the switching characteristic of said switching means being coordinated with the voltage-current characteristic of said resistance means so that said switching means will switch to its current conducting state in high-speed response to a surge of reverse bias voltage exceeding said reverse voltage peak and nearly equaling the reverse breakdown level of said thyristor;
   e. said voltage-current characteristic of said non-linear resistance means being coordinated with the reverse breakdown characteristic of said thyristor so that, when said switching means switches to its current conducting state, surge current will divide between said resistance means and said thyristor in such proportions that the maximum reverse current flowing through said thyristor is lower than a predetermined critical magnitude which can damage said thyristor.

2. The improvement of claim 1 in which said switching means comprises a PNPN semiconductor element poled inversely to said thyristor.

3. The improvement of claim 1 in which current of at least a certain threshold magnitude must flow through said switching means in order for said switching means to switch to said current conducting state when its voltage attains said breakover value, and in which a voltage drop of a predetermined magnitude will develop across said non-linear resistance means when the latter is conducting current of said threshold magnitude, the sum of said predetermined magnitude and said breakover value being nearly equal to said reverse breakdown level.

4. The improvement of claim 3 in which said switching means comprises a PNPN semiconductor element poled inversely to said thyristor.

5. The improvement of claim 4 in which a resistor is connected in parallel circuit relationship with said PNPN element to calibrate the current through said switching means so that the magnitude thereof equals said threshold magnitude at the breakover point of said element.

6. The improvement of claim 1 in which the voltage-current characteristic of said non-linear resistance means is coordinated with the reverse breakdown characteristic of said thyristor so that when said switching means switches to its current conducting state said resistance means will divert from said thyristor between approximately 60 and 99 percent of the total surge current flowing through both said resistance means and said thyristor at the peak magnitude thereof.

7. The improvement of claim 1 in which the maximum reverse current flowing through said thyristor is less than approximately two-thirds of the current in said non-linear resistance means at the peak magnitude of the total surge current.

8. The improvement of claim 7 in which the maximum reverse current which flows through said thyristor is higher than approximately 5 amperes.

9. The improvement of claim 1 in which said non-linear resistance means has the following voltage-current characteristic: $I = (V/C)^\alpha$, where I is current in said resistance means, $V$ is voltage across said resistance means, $\alpha$ is a number higher than 10, and $C$ is a constant selected so that when the magnitude of $V$ is the same as the magnitude of voltage across said thyristor when conducting reverse current equal to said critical magnitude, the magnitude of $I$ is greater than the difference between the peak magnitude of surge current and said critical magnitude.

10. The improvement of claim 9 in which C is selected so that when the magnitude of V is the same as the magnitude of voltage across said thyristor when conducting reverse current equal to one percent of the peak magnitude of surge current, the magnitude of I is not greater than 99 percent of said peak magnitude.

* * * * *